United States Patent [19]

Vetterling

[11] Patent Number: 4,942,436
[45] Date of Patent: Jul. 17, 1990

[54] SUPERLATTICE AVALANCHE PHOTODETECTOR

[75] Inventor: William T. Vetterling, Lexington, Mass.

[73] Assignee: Polaroid Corporation, Cambridge, Mass.

[21] Appl. No.: 265,035

[22] Filed: Oct. 31, 1988

[51] Int. Cl.$^5$ .................. H01L 29/205; H01L 27/14
[52] U.S. Cl. ........................................ 357/4; 357/16; 357/30
[58] Field of Search .............................. 357/4, 16, 30

[56] References Cited

U.S. PATENT DOCUMENTS 4,839,700  6/1989  Brennan .............................. 357/30

OTHER PUBLICATIONS

Brennman, *IEEE Trans. on Elec. Dev.*, "The p-n Junction in Applications", vol. ed. 34, no. 4, Apr. 87, p. 782.
Law et al., *Appl. Phys. Lett.* 35(2) 15 Jul. 79, pp. 180–182 "State-of-the-Art . . . photodiodes".
"Current Fluctuations in a Semiconductor (Dielectric) Under the Conditions of Impact Ionization and Avalance Breakdown", by A. Tager, *Sov. Phy.-Solid State*, vol. 6, No. 8, Feb. 1965, pp. 1919–1925,
"Band Structures and Pseudopotential From Factors for Fourteen Semiconductors of the Diamond and Zinc-Blende Structures", by M. Cohen and T. Bergstresser, *Phys. Rev.*, vol. 141, No. 2, Jan. 1966, pp. 789–796.
"Multiplication Noise in Uniform Avalance Diodes", by R. McIntyre, *IEEE Trans. Electron Dev.*, vol. ED—13, No. 1, Jan. 1966, pp. 164–168.
"Impact Ionization in Multilayered Heterojunction Structures", by R. Chin, N. Holonyak, G. Stillman, J. Tang and K. Hess, *Electronics Letters*, vol. 16, No. 12, Jun 5, 1980, pp. 467–469.
"The Channeling Avalance Photodiode: A Novel Ultra-low-Noise Interdigitated p-n Junction Detector", by F. Capasso, *IEEE Trans. Electron DevEC.*, vol. Ed≧29, No. 9, Sep. 1982, pp. 1388–1395.
"Single-Carrier-Type Dominated Impact Ionization in Multilayer Structures", by H. Blauvelt, S. Margalit, and A. Yariv, *Electronics Letters*, vol. 18, No. 9, Apr. 29, 1982, pp. 375–376.
"Staircase Solid-State Photomultipliers and Avalance Photodiodes with Enhanced Ionization Rates Ratio", by F. Capasso, W. Tsang and G. Williams, *IEEE Trans. Electron Dev.*, vol, ED-30, No. 4, Apr. 1983, pp. 381–390.
"Turnable Barrier Heights and Band Discontinuities Via Doping Interface Dipoles: An Interface Engineering Technique and its Device Applications", by F. Capasso, K. Mohammed and A. Cho, *J. Vac. Sci. Technology B*, vol. 3, No. 4, Jul./Aug., 1985, pp. 1245–1251.
"Optimization and Modeling of Avalance Photodiode Structures: Application to a New Class of Superlattice Photodetectors, the p-i-n, pn Homojunction and p-n Heterojunction APD's", by K. Brennan, *IEEE Trans. Electron Dev.*, vol. ED-34, No. 8, Aug. 1987, pp. 1658–1669.

*Primary Examiner*—Jerome Jackson, Jr.
*Attorney, Agent, or Firm*—Edward S. Roman

[57] ABSTRACT

A low noise avalanche photodetector (APD) having repeated superlattice units. Where the principal ionizing carriers are electrons, each unit is formed from p+-n+ layers of a first material, a near intrinsic layer of the first material, and a near intrinsic layer of a second material having an ionization threshold which is larger than that of the first material. Such an APD can be fabricated in a GaAs/AlGaAs material system.

16 Claims, 3 Drawing Sheets

SUPERLATTICE AVALANCHE PHOTODETECTOR

TECHNICAL FIELD OF THE INVENTION

The present invention pertains to optical detectors and, in particular, to a superlattice avalanche photodetector (APD).

BACKGROUND OF THE INVENTION

The signal-to-noise power ratio of a photodetector is proportional to:

$$1/[2q(i_p+i_d)(F_e B)+4kTB/(R_{eq}\underline{M}^2)] \qquad (1)$$

where q is the electronic charge, $i_p$ is the primary photocurrent, $i_d$ is the dark current, $F_e$ is the excess noise factor, B is the bandwidth, k is Boltzmann's constant, T is the temperature, $R_e$ is the equivalent resistance of the load, and $\underline{M}$ is the gain. As one can readily appreciate from this, the signal-to-noise power ratio of the photodetector increases as the contributions of the first and second terms in the denominator of eqn (1) decrease. Further, the contribution of the first term is made smaller if the excess noise factor, $F_e$, decreases and the contribution of the second term, representing thermal noise, is made smaller if the gain increases. Thus, in order to increase the signal-to-noise power ratio of the photodetector, it is desirable to have low noise and high gain.

In a p-n junction device, noise arises from the generation and subsequent collection of independent charge carriers. In an avalanche photodiode (APD), additional noise arises from the fluctuation in the carrier multiplication since, in general, this amplification is not fully deterministic. A. S. Tager, in an article entitled "Current Fluctuations In A Semiconductor (Dielectric) Under The Conditions Of Impact Ionization and Avalanche Breakdown," in *Sov. Phy. - Solid State*, Vol. 6, 1965, pp. 1919–1925, and later R. J. McIntyre, in an article entitled "Multiplication Noise In Uniform Avalanche Diodes," *IEEE Trans. Electron Dev.*, Vol. ED-13, 1966, pp. 164–168, demonstrated that the avalanche multiplication process produces the least noise for electron multiplication when "a" is much greater than "b". Conversely, for hole multiplication, it is desirable that "b" be much greater than "a".

The following refers to prior art which disclose semiconductor photodetector devices having structures that increase the ratio of electron and hole ionization rates in the devices:

(1) An article entitled "Impact Ionization In Multilayered Heterojunction Structures," by R. Chin, N. Holonyak, G. E. Stillman, J. Y. Tang, and K. Hess, Electronics Letters, Vol. 16., 1980, pp. 467–469, discloses the use of a superlattice structure consisting of alternating thin layers of GaAs and $Al_xGa_{1-x}As$ in an attempt to increase the ratio of electron and hole ionization rates in a quantum well APD. In these devices, both the electron and hole ionization rates are enhanced above their respective values in the bulk material, however, the enhancement of the hole ionization rate is much less than that of the electron ionization rate.

(2) An article entitled "The Channeling Avalanche Photodiode: A Novel Ultra-Low-Noise Interdigitated p-n Junction Detector," by F. Capasso, *IEEE Trans. Electron Dev.*, Vol. ED-29, 1982, pp. 1388–1395 discloses the use of a superlattice structure consisting of alternating n-GaAs and $p-Al_{0.45}Ga_{0.55}As$ layers in another attempt to increase the ratio of electron and hole ionization rates in a channeling APD. The channeling APD is configured so that a reverse bias produces both transverse and longitudinal electric field components therein. The transverse field sweeps holes out of the GaAs layers and into adjacent $Al_{0.45}Ga_{0.55}As$ layers while confining the electrons within the GaAs layers. The ensuing separation of charged carriers leads to substantially different ionization rates for the two carrier species.

(3) An article entitled "Staircase Solid State Photomultipliers And Avalanche Photodiodes With Enhanced Ionization Rate Ratio," by F. Capasso, W. T. Tsang and G. F. Williams, *IEEE Trans. Electron Dev.*, Vol, ED-30, 1983, pp. 381–390 discloses the use of a superlattice structure whose layers have a graded energy bandgap in yet another attempt to increase the ratio of electron and hole ionization rates in a graded gap staircase APD. In such an APD, impact ionization events occur at specific and localized areas within the device, whereas, in a channeling APD impact ionization events occur randomly throughout each layer. Because impact ionization is localized in a graded gap staircase APD, the variability and, hence, the gain fluctuation of the number of electrons generated per photon is reduced. Thus, the excess noise in the graded gap staircase APD is lower than that in a conventional uniform APD and in a channeling APD. Nevertheless, a graded gap staircase APD fabricated from GaAs/AlGaAs material does not achieve the optimum low-noise condition because the conduction band edge offset between GaAs and AlGaAs is not a large enough fraction of the energy bandgap of GaAs to cause a sufficient difference in "a" and "b".

(4) An article entitled "Single-Carrier-Type Dominated Impact Ionization In Multilayer Structures," by H. Blauvelt, S. Margalit, and A. Yariv, *Electronics Letters*, Vol. 18, 1982, pp. 375–376, referred to hereinafter as Blauvelt et al, discloses the use of a doped superlattice structure consisting of $p^+$-i $n^+$AlGaAs layers followed by near intrinsic GaAs and AlGaAs layers in still yet another attempt to increase the ratio of electron and hole ionization rates in a quantum well APD. This structure is aimed at increasing the effective difference between "a" and "b" by presenting a short region of high electric field. This field "launches" electrons into GaAs with a velocity that makes ionization probable, but launches holes into AlGaAs at an energy which is insufficient for ionization in that material.

(5) An article entitled "Tunable Barrier Heights And Band Discontinuities Via Doping Interface Dipoles: An Interference Engineering Technique And Its Device Applications," by F. Capasso, K. Mohammed, and A. Y. Cho, *J. Vac. Sci. Technol.*, B3(4), Jul/Aug 1985, pp. 1245–1251, referred to hereinafter as Capasso et al, discloses the use of a doped superlattice structure consisting of i-$p^+$-i GaAs layers followed by i-$n^+$-i AlGaAs layers in still yet another attempt to increase the ratio of electron and hole ionization rates in a quantum well APD (a similar structure is also disclosed in an InP/GaInAs material system). This structure is intended to have the same effect as that described for the device disclosed in Blauvelt et al but it differs in that it consists of $p^+$- and $n^+$-doped regions which are disposed on opposite sides of a GaAs-AlGaAs heterojunction.

(6) A patent application entitled "Avalanche Photodetector," by Kevin F. Brennan, Ser. No. 894,004, Filed Aug. 7, 1986, discloses the use of a doped superlattice structure consisting of $p^+$-$n^+$ AlGaAs layers followed by near intrinsic GaAs and AlGaAs layers in still yet again another attempt to increase the ratio of electron and hole ionization rates in a quantum well APD. This structure, like the structure disclosed in Blauvelt et al, is designed to spatially restrict the regions wherein impact ionization occurs in order to minimize the variability of the number of electrons generated per detected photon. Unfortunately, the devices disclosed in the Blauvelt et al article and in the Brennan patent application are difficult to fabricate because it is very difficult to control the n-type dopant in the AlGaAs material. Specifically, at the temperatures used to grow the AlGaAs alloy layers, the n-type dopant is very mobile and tends to be transported with the growth interface rather than staying in place at the location at which it was first deposited. This behavior of n-type dopants in AlGaAs is different from the behavior of n-type dopants in GaAs (which is grown at lower temperature). Further, attempts to grow AlGaAs layers at lower temperatures so that n-type dopants would remain fixed therein, have generally produced poor quality AlGaAs layers.

In light of the above, a need exists for a low noise, high gain APD.

SUMMARY OF THE INVENTION

An embodiment of the present invention is a low noise, high gain avalanche photodetector (APD) comprising repeated superlattice units formed from two materials. In a first embodiment of the inventive APD, each superlattice unit comprises, in sequence: $p^+$-$n^+$ layers of a first material; a near intrinsic layer of the first material; and a near intrinsic layer of a second material having an ionization threshold which is larger than that of the first material. Since ionization thresholds of semiconductors are generally proportional to bandgap, any two semiconductors with different bandgaps could be used. Further, in a second embodiment of the inventive APD, each superlattice unit comprises an additional, near intrinsic layer of the first material which is disposed between the $p+$ and $n+$ layers.

As one can readily appreciate, one advantage provided by embodiments of the present invention, especially embodiments that are fabricated in a GaAs/AlGaAs material system, is that the AlGaAs material is not doped with n-type dopants. As a result, because GaAs layers may be grown at lower temperature than AlGaAs layers, the n-type dopants do not move in the GaAs layers as they would in AlGaAs layers. Further, because the $p+$ and $n+$ doped layers are formed in sequence in GaAs, the appropriate dopants can be added during fabrication, in sequence, during a constant temperature growth. As a result, the inventive device is somewhat simpler to fabricate than some of the devices described above which exist in prior art.

Notwithstanding the above, at first glance, there appears to be one possible drawback of the inventive APD. That drawback is that holes may accelerate in the high field GaAs $p^+$-$n^+$ layers of each superlattice unit, impact ionize therein, and cause the inventive APDs to be noisy as a result of an effectively lower ratio of "a" to "b". However, the inventive APD has been analyzed by using a model disclosed in an article entitled "Optimization and Modeling of Avalanche Photodiode Structures: Application to a New Class of Superlattice Photodetectors, the p-i-n, pn Homojunction and p-n Heterojunction APD's" by Kevin F. Brennan, *IEEE Trans. Electron Dev.*, Vol. ED-34, No. 8, August, 1987, pp. 1658–1669, to determine the noise and gain of embodiments of the present invention. The results of such analysis, suprisingly, demonstrate that properly designed embodiments of the present invention can be low noise APDs.

Further, in accordance with the quanitative results obtained as a result of analyzing the inventive APDs with the above-described model, the following are some of the qualitative principles that are useful to consider in choosing specific design parameters for an embodiment of an APD fabricated in accordance with the present invention for the GaAs/AlGaAs material system: (1) the doping of the $p^+$-$n^+$ GaAs layers should be high enough to provide a high electric field therein but the $p^+$-$n^+$ layers should not be so wide that substantial impact ionization occurs therein by holes; (2) the intrinsic GaAs layer should be wide enough to promote effective impact ionization of electrons but not be so wide that substantial hole ionization occurs; and (3) the near intrinsic AlGaAs layer should be sufficiently wide that holes can cool therein after drifting through the high field $p^+$-$n^+$ GaAs layers, however, not wider than necessary in order to preserve response bandwidth and to avoid unnecessary electron-hole recombination.

BRIEF DESCRIPTION OF THE DRAWING

A complete understanding of the present invention may be gained by considering the following detailed description in conjunction with the accompanying drawing, in which.

To facilitate understanding, identical reference numerals are used to designate elements common to the figures.

DETAILED DESCRIPTION

Figure 1:
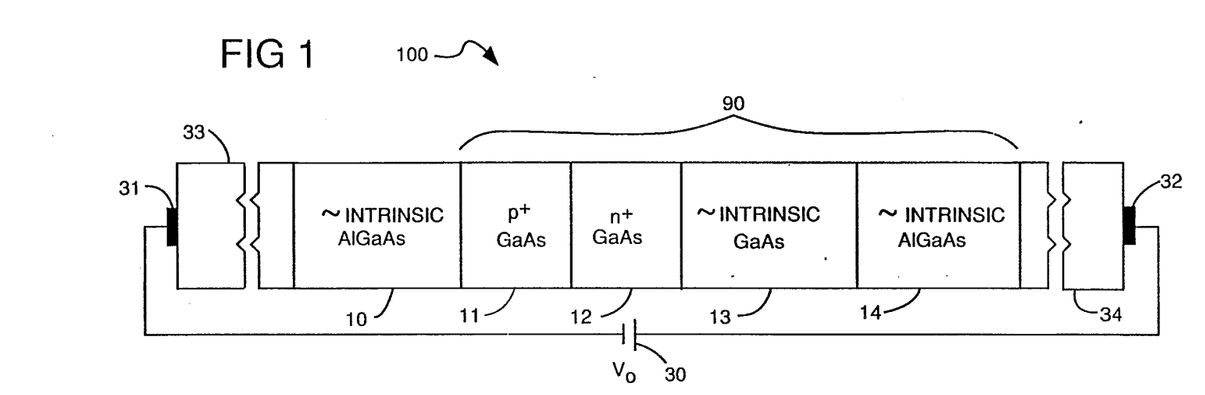
FIG. 1 shows, in pictorial form, an APD and a superlattice unit thereof fabricated in accordance with a first embodiment of the present invention.
Figure 2:
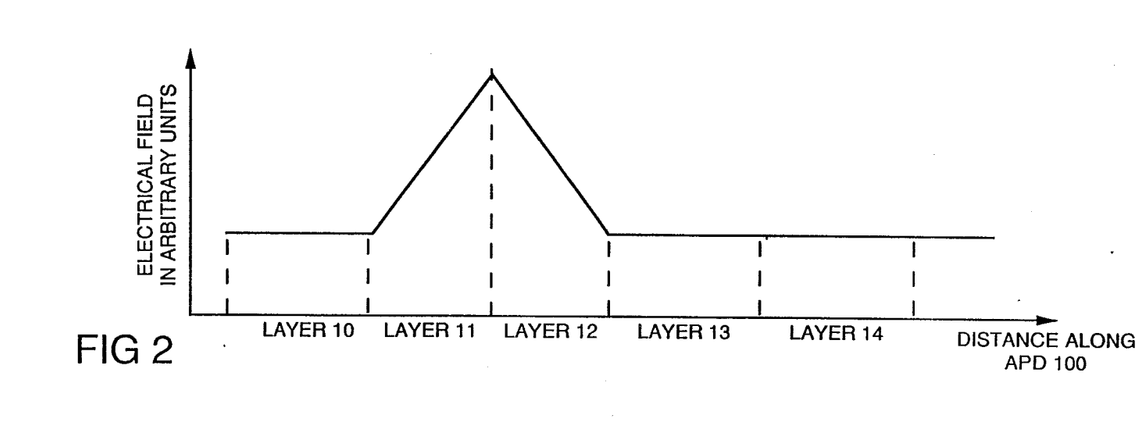
FIG. 2 shows, in graphical form, an electric field profile of the superlattice unit shown in FIG. 1.

FIG. 1 shows APD 100 which is fabricated in a GaAs/AlGaAs material system in accordance with the present invention. APD 100 is reverse biased by voltage source 30 which is contacted to electrodes 31 and 32. Electrodes 31 and 32 are contacted, in turn, to $p^+$ region 33 and $n^+$ region 34, respectively. Further, as shown in FIG. 1, APD 100 is comprised of repeating superlattice units such as superlattice unit 90. Superlattice unit 90 comprises $p^+$ GaAs layer 11, $n^+$. GaAs layer 12, near intrinsic GaAs layer 13, and near intrinsic AlGaAs layer 14, where, for example, each AlGaAs layer is the compound $Al_{0.45}Ga_{0.55}As$. When voltage $V_0$ from voltage source 30 is applied to electrodes 31 and 32 to reverse-bias APD 100, a region of high electric field is produced in the electric field profile of superlattice unit 90, which electric field profile is shown in FIG. 2.

When APD 100 is reverse biased, electrons are accelerated in the high electric field region of layers 11 and 12 and are injected therefrom into GaAs layer 13. Impact ionization of the electrons preferentially occurs in GaAs layer 13 but, as those of ordinary skill in the art can readily appreciate, some impact ionization also occurs within p+-n+ GaAs layers 11 and Holes, on the other hand, are accelerated in the low electric field region of AlGaAs layer 14 before being injected into GaAs layer 13 and, as a result, the holes are not subjected to a high electric field before injection into narrow bandgap GaAs layer 13. Thus, few, if any, hole impact ionization events occur within GaAs layer 13. However, the holes also drift in the high electric field of p+-n+ GaAs layers 11 and 12 and suffer some impact ionization therein. Indeed, at first glance, one might conclude that there is a good chance that a substantial number of the holes will impact ionize within p+-n+ GaAs layers 11 and 12 and, thereby, create a noisy device. However, modeling, as will be explained in detail below, shows that the APDs fabricated in accordance with the present invention, can, surprisingly, provide low noise APDs. After being accelerated in p+-n+ GaAs layers 11 and 12, the holes enter low field intrinsic AlGaAs layer 10 of the next superlattice unit of which only the intrinsic AlGaAs region 10 is shown. The bandgap in layer 10 is larger than the bandgap in p+ GaAs layer 11 and, if the design parameters are chosen correctly, the holes will not have sufficient energy to impact-ionize in this region. Instead, the holes will lose, via phonon interactions, energy that they have gained from the high-field region.

Figure 3:
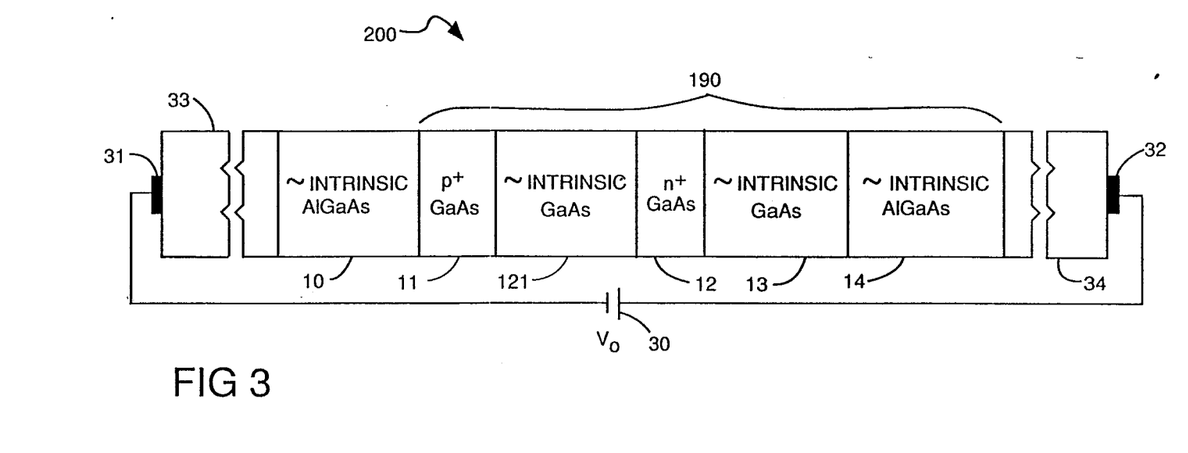
FIG. 3 shows, in pictorial form, an APD and a superlattice unit thereof fabricated in accordance with a second embodiment of the present invention.

FIG. 3 shows APD200 which is fabricated in a GaAs/AlGaAs material system in accordance with a further embodiment of the present invention. As shown in FIG. 3, the superlattice units of APD 200, such as superlattice unit 190, differ from the superlattice units of APD 100, such as superlattice unit 90, in that superlattice 190 further comprises a near intrinsic GaAs layer 121 which is disposed between p+ and n+ GaAs layers 11 and 12.

Figure 4:
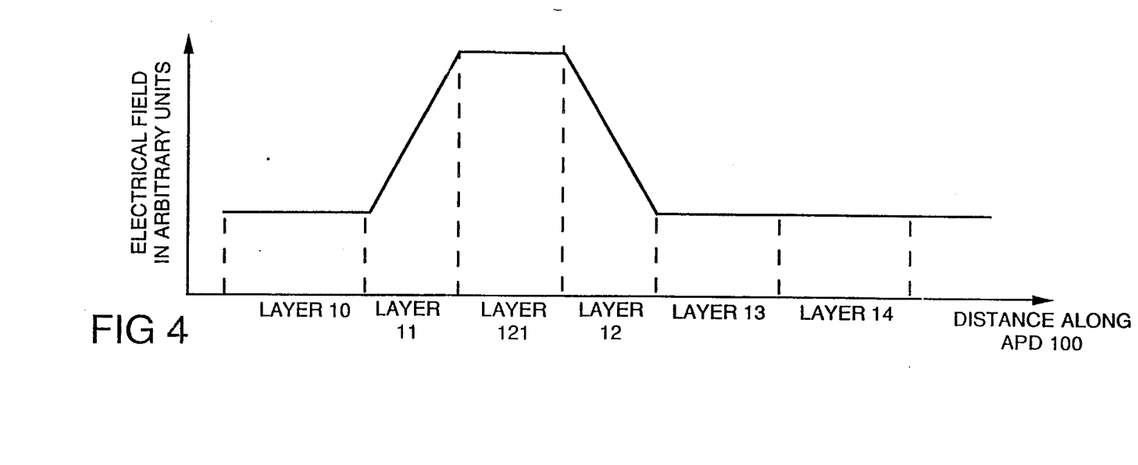
FIG. 4 shows, in graphical form, an electric field profile of the superlattice unit shown in FIG. 3.

When voltage $V_0$ from voltage source 30 is applied to electrodes 31 and 32 to reverse-bias APD 200, a region of high electric field is produced in the electric field profile of superlattice unit 190, which electric field profile is shown in FIG. 4.

Further, the electrons and holes interact in APD200 much in the same manner that the electrons and holes interacted, as described above, in APD 100, except for the longer acceleration of holes and electrons in the high electric field of layer 121.

Various ones of the first and second embodiments of inventive APD were analyzed using a model disclosed in an article entitled "Optimization and Modeling of Avalanche Photodiode Structures: Application to a New Class of Superlattice Photodetectors, the p-i-n, pn Homojunction and p-n Heterojunction APD's" by Kevin F. Brennan, *IEEE Trans. Electron Dev.*, Vol. ED-34, No. 8, August, 1987, pp. 1658-1669, to determine ranges of values for certain parameters of the inventive APD, such as, for example, layer thicknesses and doping concentrations. The model disclosed in the article is a many-particle, ensemble Monte Carlo model which solves the Boltzmann Transport Equation in a Monte Carlo calculation which includes the full details of the band structure of the two materials in the superlattice unit.

For example, the GaAs conduction band structure used in the model is derived from an empirical pseudopotential calculation disclosed in an article entitled "Band Structures and Pseudopotential Form Factors for Fourteen Semiconductors of the Diamond and Zinc-Blende Structures," by M. L. Cohen and T. K. Bergstresser, *Phys Rev.*, Vol. 141, 1966, pp. 789-796; the AlGaAs conduction band structure is derived from the GaAs conduction band structure by using a modified energy gap and ionization energy; and the GaAs and $Al_{0.45}Ga_{0.55}As$ valence band structures are derived using a k*p calculation.

FIG. 2 shows the "built-in field" profile within p+-n+ layers 11 and 12 of APD100 which is calculated from the one-dimensional Poisson equation. The term "built-in field" refers to the high electric field which results from the doping within p+-n+ layers 11 and 12. The reverse bias applied by voltage source 30 should be sufficiently large to deplete p+ layer 11 and n+ layer 12. When these layers are fully depleted, additional reverse bias will add a constant electric field perpendicular to the layers, which constant electric field acts primarily to accelerate carriers through the remainder of the structure. The term "applied field" refers to the electric field which results from the voltage applied by voltage source 30. Thus, in the highly doped region of layers 11 and 12, the electric field is the sum of the "built-in field" and the "applied field," whereas, in the intrinsic region, the electric field is just the "applied field."

The effect of the GaAs/AlGaAs heterointerfaces between layers 10 and 11 for electrons, and between layers 13 and 14 for holes, are not central to the operation of the inventive APD. This is because electrons are injected into intrinsic GaAs layer 13 where the majority of electron impact ionization events occur from GaAs layer 12. Further, holes have been substantially slowed down in AlGaAs layer 14 before they are injected across the GaAs/AlGaAs heterointerface and into GaAs layer 13. However, nearly intrinsic AlGaAs layer 14 should be wide enough so that holes are cooled before being injected into GaAs layer 13 in order to ensure that little impact ionization of holes will occur therein. Nevertheless, AlGaAs layer 14 should not be so wide that the response time of the APD is too slow for a particular application, nor so wide as to allow unnecessary recombination of electrons and holes. Still further, hole ionization within the high electric field region of p+-n+ GaAs layers 11 and 12, for APD 100, and within the high electric field region of p+-i-n+ GaAs layers 11, 121, and 12, for APD 200, as well as within nearly intrinsic GaAs layer 13, for both embodiments, is to be avoided. This places further constraints on the doping levels and layer widths used in APDs 100 and 200.

A detailed discussion of the flow chart of the Monte Carlo analysis can be found in the above-referenced article. As explained in the article, the results obtained by using the Monte Carlo analysis must be analyzed together with other factors which are crucial in determining whether the particular design established by the Monte Carlo analysis corresponds to a practical APD. Two crucial factors are P, the probability that an electron will ionize in each stage of a device, and Q, the probability that a hole will ionize in each stage of the device.

The excess noise factor of an APD, i.e., the standard measure of avalanche noise, can be expressed as:

$$F_e = <N_m^2>/<N_m>^2 \tag{3}$$

where $N_m$ is the gain random variable for a single event at the input to an m-unit device, i.e. the total number of carriers generated at the output of the m-unit device which result from a single primary event at the input. The excess noise factor can be expressed in terms of the mean and the variance of $N_m$ as:

$$F_e = 1 + [Var(N_m)/<N_m>^2]. \quad (4)$$

In general, the excess noise factor in an APD fabricated in accordance with the present invention can be expressed as:

$$F_e = 1 + [(1-1/\underline{M})(1-k_s)/(2+P(1+k_s))]^* \\ [-P + 2(1-k_s P^2)/(1+k_s P)[\underline{M}k_s(1+P)/(1-k_s) + 1/(1+P)]] \quad (5)$$

and $\underline{M}$, the gain, can be expressed as:

$$\underline{M} = (1+P)^m(1-k_s)/[(1+k^s P)^{m+1} - k_s(1+P)^{m+1}] \quad (6)$$

where P is the probability that an electron will ionize in each stage, Q is the probability that a hole will ionize in each stage, $k_s$ is the ratio of Q to P, and m is the number of units within the device.

Eqn (6) shows that the gain will diverge at some value of m, known as avalanche breakdown, unless Q=0. However, no avalanche breakdown occurs when Q=0. In fact, when Q=0, in addition to avoiding avalanche breakdown, the excess noise factor always lies between 1 and 2 for all values of P and m, and it approaches 1 at large values of P. In principle then, when Q=0, any gain can be achieved without more than a factor of two increase in noise from the ideal case, depending of course on the number of stages in the device and within practical limitations on device size and speed.

When Q is not zero, the gain that can be achieved without a dramatic increase in the noise factor is limited. As Q decreases, larger values of P are possible at fixed m before avalanche breakdown occurs, and the noise factor pertaining to a given gain becomes smaller. For lowest noise factor, it is generally advisable, according to these equations, to seek the smallest attainable value of Q, even if P is relatively small. Of course, if this criterion is carried to an extreme in which P is vanishingly small, then the number of stages m that will be required for a specific net gain will become unwieldy. However, it is usually found for the inventive APDs that Q can be made zero, or nearly zero, while P remains a value of practical size. This being the case, the best performance may be considered to be that for which P is made as large as possible while Q remains zero.

In accordance with the results of the model, P increases strongly as the built-in field within p+n+ layers 11 and 12 increases, at fixed applied field throughout. In addition, the average distance the electrons travel from the interface between layers 12 and 13 before impact ionizing in layer 13 decreases. The electrons are "superheated" by the electric field in p+-n+ layers 11 and 12 such that their distribution is greatly shifted in energy. Immediately thereafter, the electrons are injected into GaAs layer 13. As a result, the electrons overshoot their steady state energy, i.e. they gain more energy from the field than is lost to phonons, and they are accelerated semiballistically to energies at or above the ionization threshold energy. In this way, the electron ionization rate within GaAs layer 13 is greatly increased from its bulk value. However, as P increases through the action of the built-in field, so does the hole ionization rate. Consequently, a tradeoff exists between the hole ionization rate and P, i.e., the favorable increase in P is offset by an unfavorable increase in Q.

In accordance with the results of the model, P should have a maximum at a certain layer width for layers 11 and 12. This can be understood on a physical basis as follows. The "super heating" of the electron distribution depends upon the width of the p+-n+ 11 and 12. When the width of p+-n+ layers 11 and 12 is small, the net energy gain from the electric field per electron is not large. As a result, most electrons do not impact ionize upon being injected into GaAs layer 13. As the width of layers 11-12 increases, however, more electrons become hot enough so that they impact ionize upon being injected into GaAs layer 13. However, if the width of p+-n+ layers 11 and 12 becomes too large, some hole impact ionization will occur therewithin.

In addition, there are hole impact ionization events which occur within GaAs layer 13. This occurs even though the holes have to pass through the cooling region of low field AlGaAs layer 14 before being injected into GaAs layer 13 from the high field region of the superlattice unit to the right of unit 90 because the cooling within layer 14 is insufficient to totally reduce the hole ionization rate.

Further in accordance with the results of the model, P is small for small widths of GaAs layer 13. However, the width of GaAs layer 13 should not be unnecessarily large because this would lead to excess electron-hole recombination as well as to a loss of operating bandwidth.

Still further, in accordance with the results of the model, the electron and hole ionization rates decrease as the width of the low field region increases, either through increasing the width of GaAs layer 13 or low field AlGaAs layer 14. This is because the low field region of GaAs layer 13 and AlGaAs layer 14 cools both the electron and hole distributions. However, the hole ionization rate decreases more with increasing width of the low field region than does the electron ionization rate because the hole-energy relaxation rate is much larger than the electron relaxation rate and, as a result, holes relax faster to the corresponding low field steady state distribution.

Although a desired APD design corresponds to one having a large gain at low excess noise, the model results show that it is very difficult to obtain a high value of P at zero hole ionization. Further, in order to achieve a high gain, i.e., large electron ionization rate, it is unavoidable that some residual hole ionization occurs in the present structure and this has the dual disadvantage of increasing the excess noise factor and limiting the usable gain by the advent of avalanche breakdown. As a result, a tradeoff exists between a low noise but also low gain device, i.e., Q is zero but P is small, versus a high gain but noisier device, i.e., Q is nonzero but P is large.

As a result of applying the above-described Monte Carlo analysis method, we have found the following designs to be representative of those considered for the embodiments shown in FIGS. 1 and 3. In all of the cases shown here, low field GaAs layer 13 and AlGaAs layer 14 are taken to have widths of 100 angstroms and 350 angstroms, respectively. These dimensions have been determined, by a series of simulations of the inventive device design and of previous APD device designs such as those described in the Brennan patent application Ser. No. 894,004 referred to in the Background of the Invention, to offer reasonable, but not excessive, opportunity for electron ionization and cooling of holes. Moreover, the efficacy of these values can also be demonstrated through straightforward arguments involving the phonon cross-section. In the tables set forth below, we shall concentrate on the more important device characteristics.

We will specify the remaining device dimensions in terms of the following three parameters:

1. $t_p$—the thickness of p+-doped layer 11;
2. $t_i$—the thickness of intrinsic layer 121 which is disposed between p+ and n+ layers 11 and 12; and
3. $t_n$—the thickness of n+-doped layer 12.

Notice that the embodiment shown in FIG. 1 is associated with a value of zero for $t_i$, while the embodiment shown in FIG. 3 has $t_i$ not equal to zero.

In addition to the above-described three parameters, the operation of the inventive APD devices also depends on two further parameters:

1. the magnitude of the built-in field E; and
2. the doping level of the p+- and n+-doped layers 11 and 12, which doping levels are taken to be the same.

We now offer tables showing design considerations for use in fabricating preferred embodiments of the inventive APD, which tables were generated by using the Monte Carlo model. The data shown in the tables correspond to computer simulations wherein the values of all the device parameters but one were held fixed to show the effect of varying the remaining parameter.

TABLE I

Effect of $t_i$
$t_p$ = 50 angstroms, $t_n$ = 50 angstroms, E = 150 kV/cm
Doping = 6.42 × 10^18
($t_p$ and $t_n$ are taken to have the smallest achievable values)

| $t_i$(angstroms) | P | Q |
|---|---|---|
| 0 | .052 | .000 |
| 50 | .088 | .000 |
| 100 | .13 | .0042 |

TABLE II

Effect of Doping
$t_p$ = 150 angstroms, $t_n$ = 150 angstroms, $t_i$ = 0 angstroms
E = 150 kV/cm

| Doping | P | Q |
|---|---|---|
| 1.30 × 10^18 | .09 | .000 |
| 1.50 × 10^18 | .10 | .002 |
| 1.90 × 10^18 | .14 | .003 |
| 2.14 × 10^18 | .16 | .005 |
| 2.38 × 10^18 | .19 | .006 |

TABLE III

Effect of the Built-In Field
$t_p$ = 50 angstroms, $t_n$ = 50 angstroms, $t_i$ = 50 angstroms
Doping = 6.4 × 10^18

| E | P | Q |
|---|---|---|
| 100 kV/cm | .052 | .000 |
| 150 kv/cm | .088 | .000 |
| 200 kV/cm | .138 | .003 |

Tables I to III illustrate boundaries which constrain the device parameters for preferred embodiments. Table I, for example, illustrates that for the chosen fixed values of doping, field, $t_p$ and $t_n$, an increase in the width of intrinsic layer 121 leads to an increase, first of the value of P with Q=0, and then, to a departure of Q from zero. This behavior is typical and applies as well to other choices of the fixed parameters. For example, for $t_i$=0 angstroms, the value of Q is zero, as desired, but P is quite small. However, as t is increased, P increases, to the benefit of performance, until finally Q becomes nonzero and the noise factor begins to degrade.

Table II shows a similar trend for the response to doping level changes when t is fixed at zero angstroms, and the built-in field, $t_p$, and $t_n$ are given the indicated values. For example, at lower doping, a reasonable value of P may be obtained with Q=0. However, as the doping increases, P increases until finally Q departs from zero with the consequent degradation of the noise factor.

For fixed $t_i$, $t_p$, $t_n$, and doping, as shown in Table III, the dependence of P and Q on the magnitude of the built-in field also shares similar characteristics. By designing a built-in field large enough to obtain a significant value for P without hole ionization, we can maintain low noise. Thus, given the largest value of P consistent with Q=0, we achieve the gain desired for a given application by choosing an appropriate number of stages.

In all three tables, it is seen that values of P of approximately 0.1 are achievable with Q=0. For this reason, we can adopt the approximate rule that in the GaAs/AlGaAs system with p+-n+ or p+-i-n+ GaAs region, a gain of approximately 1.1 per stage is obtainable with low noise.

Figure 5:
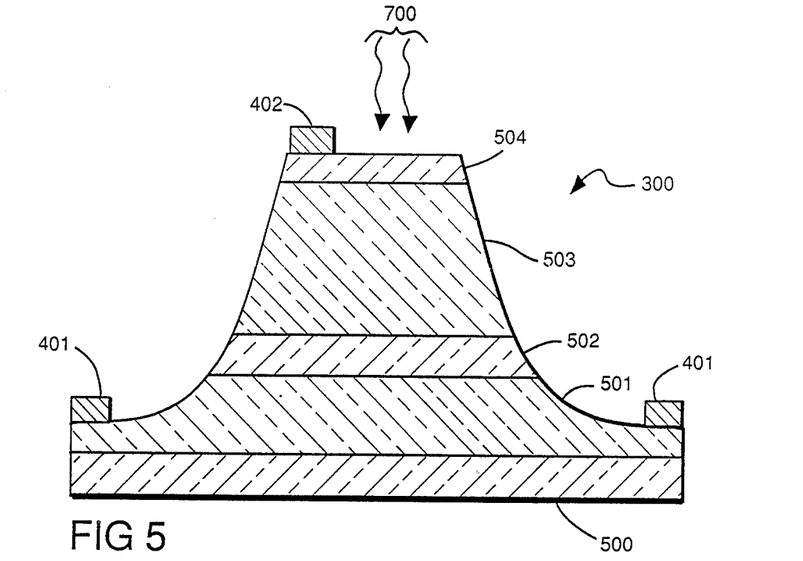
FIGS. 5 and 6 show, in pictorial form, cross-sections of two APD fabricated in accordance with the present invention.
Figure 6:
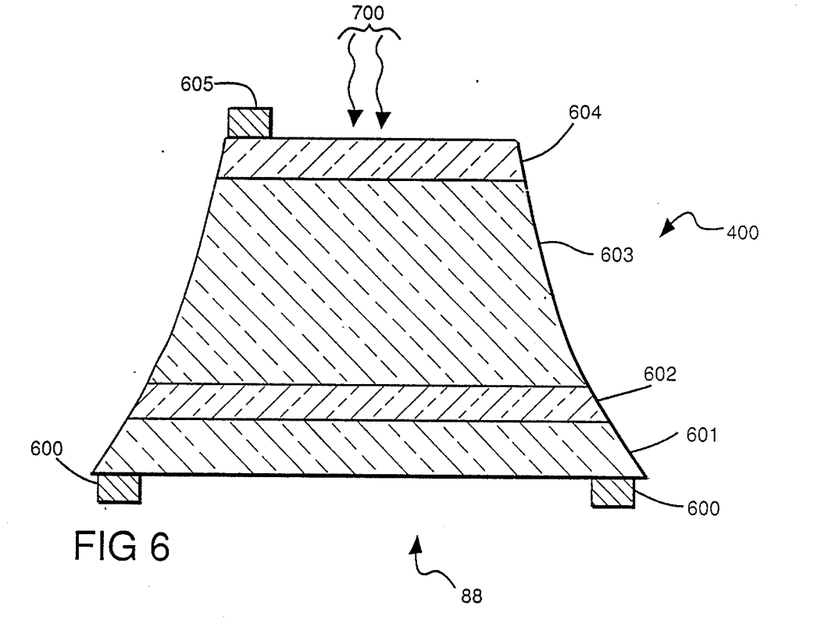

FIGS. 5 and 6 each show, in cross-sectional view, APD 300 and APD 400, respectively, fabricated in accordance with the present invention.

FIG. 5 shows APD 300 fabricated upon GaAs semi-insulating substrate 500, for example a Cr-doped (001) oriented semi-insulating GaAs substrate. Illustratively, APD 300 has a mesa geometry. n+ GaAs layer 501 is epitaxially grown upon substrate 500 by liquid phase epitaxy (LPE) or by molecular beam epitaxy (MBE); typically n+ layer 501 is doped with Si. Layer 501 is etched to permit the deposition of metal electrode 401 thereon and is highly doped to enable a low resistance connection to metal electrode 401 and a low voltage drop between the electrode and superlattice 503. Metal electrode 401 may comprise an Au-Ge alloy which is sintered onto layer 501. n-type GaAs layer 502 is epitaxially grown on layer 501.

Superlattice 503 is epitaxially grown by MBE on layer 502. Superlattice 503 comprises a multiplicity of superlattice units comprised of p+-n+ GaAs layers 11 and 12, intrinsic GaAs layer 13 and intrinsic AlGaAs layer 14 shown in FIG. 1. The number of units to be used in any particular device depends on the gain desired for the device.

p+ Al$_{0.45}$Ga$_{0.55}$As layer 504 is epitaxially grown by MBE on superlattice 503; typically, p+ layer 504 is doped using magnesium, beryllium, or zinc. Metal contact 402 is deposited on layer 504 and has an aperture to permit incident radiation 700 to impinge upon layer 504. Layer 504 is heavily doped to enable a low resistance connection to be made to metal electrode 402. The Al concentration in AlGaAs layer 504 depends upon the wavelength of the radiation one desires to detect. The maximum bandgap using the GaAs/Al$_x$Ga$_{1-x}$As material system is 1.99 eV, corresponding to x=0.45, and this represents the largest low-energy cutoff for the photons. The thickness of layer 504 depends upon the absorption coefficient of the material and the material quality, particularly the diffusion coefficient of electrons, and the surface state concentration. The higher the quality the material, the thicker the layer can be. Advantageously, the radiation should be absorbed within a diffusion length of the region where avalanche multiplication takes place; superlattice 503.

FIG. 6 shows another embodiment of the inventive APD. Here, APD 400 is fabricated upon n+ GaAs substrate layer 601. Metal electrode 600 is deposited directly upon layer 601. Hereinafter, layers 602–604 and electrode 605 are directly analogous to layers 502–504 and electrode 402 of FIG. 5.

Clearly, those skilled in the art recognize that further embodiments of the present invention may be made without departing from its teachings. For example, embodiments of the present invention may be fabricated in the AlInAs/GaInAs material system. In addition, the InGaAs/InP and InGaAsP/InP material systems are potentially useful for fabricating APDs where the principal ionizing carriers are holes. However, devices where holes are the principal ionizing carriers are not expected to be as efficient as those where electrons are the principal ionizing carriers because the relaxation coefficient for holes is greater than that for electrons. Furthermore, the order of the layers in the superlattice unit for embodiments where electrons are the principal ionizing carriers may, for convenience of growing the layers or otherwise, be as follows: a nearly intrinsic layer of a first material, a nearly intrinsic layer of a second material having a smaller ionization threshold, and n+-p+ layers of the second material. Still further, for embodiments where the principal ionizing carriers are holes, the order of the layers in the superlattice unit may be: n+-p+ layers of a first material, a nearly intrinsic layer of the first material, and a nearly intrinsic layer of a second material having a larger ionization threshold or the mirror image thereof.

What is claimed is:

1. An avalanche photodiode device comprising:
a plurality of superlattice units serially connected with respect to each other each unit of which includes the following contiguous layers in sequence:
a p+ layer of a first material;
an n+ layer of the first material;
a substantially intrinsic layer of the first material; and
a substantially intrinsic layer of a second material having a larger ionization threshold than that of the first material, said substantially intrinsic layer of said second material of each unit, excepting the last of said serially connected units, adjoining the p+ layer of the next succeeding unit to define a heterojunction therebetween.

2. An avalanche photodiode device comprising:
a plurality of superlattice units serially connected with respect to each other, each unit of which includes the following contiguous layers in sequence:
a p+ layer of a first material;
a substantially intrinsic layer of a material having an equal to larger ionization threshold than that of the first material;
an n+ layer of the first material;
a substantially intrinsic layer of the first material;
and, a substantially intrinsic layer of a second material having a larger ionization threshold than that of the first material, said substantially intrinsic layer of said second material of each unit, excepting the last of said serially connected units, adjoining the p+ layer the next succeeding unit to define a heterojunction therebetween.

3. The device of claim 2 wherein the further, substantially intrinsic layer comprises the first material.

4. The device of claim 1 wherein the first material is GaAs and the second material is a ternary compound of AlGaAs.

5. The device of claim 3 wherein the first material is GaAs and the second material is a ternary compound of AlGaAs.

6. The device of claim 1 wherein the second material is a ternary compound of AlInAs and the first material is a ternary compound of GaInAs.

7. The device of claim 3 wherein the second material is a ternary compound of AlInAs and the first material is a ternary compound of GaInAs.

8. The device of claim 1 which further comprises a highly p doped semiconductor layer adjacent the p+ layer of the first one of the serially connected units, a highly n doped semiconductor layer adjacent the substantially intrinsic layer of the first material of the last one of the serially connected units, and electrodes ohmically contacted to the highly doped p and n semiconductor layers.

9. The device of claim 3 which further comprises a highly p doped semiconductor layer adjacent the p+ layer of the first one of the serially connected units, a highly n doped semiconductor layer adjacent the substantially intrinsic layer of the first material of the last one of the serially connected units, and electrodes ohmically contacted to the highly doped p and n semiconductor layers.

10. An avalanche photodiode device comprising:
a plurality of superlattice units serially connected with respect to each other each unit of which includes the following contiguous layers in sequence:
a substantially intrinsic layer of a first material;
a substantially intrinsic layer of a second material having a smaller ionization threshold than that of the first material;
a p+ layer of the second material; and
an n+ layer of the second material, said n+ layer of the second material of each unit, excepting the last of said serially connected units, adjoining the substantially intrinsic layer of the first material of the next succeeding unit to define a heterojunction therebetween.

11. An avalanche photodiode device comprising:
a plurality of superlattice units serially connected with respect to each other, each unit of which includes the following contiguous layers in sequence:
a substantially intrinsic layer of a first material;
a substantially intrinsic layer of a second material having a smaller ionization threshold than that of the first material;
a p+ layer of the second material;
a substantially intrinsic layer of a material having an equal or larger ionization threshold than that of the second material; and
an n+ layer of the second material, said n+ layer of the second material of each unit, excepting the last of said serially connected units, adjoining the substantially intrinsic layer of the first material of the next succeeding unit to define a heterojunction therebetween.

12. The device of claim 11 wherein the further, substantially intrinsic layer comprises the second material.

13. The device of claim 10 wherein the first material is a ternary compound of InGaAs and the second material is InP.

14. The device of claim 10 wherein the first material is a quaternary compound of InGaAsP and the second material is InP.

15. The device of claim 12 wherein the first material is a ternary compound of InGaAs and the second material is InP.

16. The device of claim 12 wherein the first material is a quaternary compound of InGaAsP and the second material is InP.

* * * * *